United States Patent [19]
Tokunaga

[11] Patent Number: 5,883,702
[45] Date of Patent: Mar. 16, 1999

[54] STAGE DRIVING EXPOSURE APPARATUS WHEREIN THE NUMBER OF DRIVING DEVICES EXCEEDS THE DEGREES OF FREEDOM OF THE STAGE

[75] Inventor: Masateru Tokunaga, Yokohama, Japan

[73] Assignee: Nikon Corporation, Tokyo, Japan

[21] Appl. No.: 934,728

[22] Filed: Sep. 22, 1997

Related U.S. Application Data

[63] Continuation of Ser. No. 679,396, Jul. 9, 1996, abandoned.

[30] Foreign Application Priority Data

Jul. 11, 1995 [JP] Japan .................................. 7-198183

[51] Int. Cl.⁶ ............................ G03B 27/42; G05B 19/33
[52] U.S. Cl. .............................................. 355/53; 318/575
[58] Field of Search ................................ 355/53; 318/575

[56] References Cited

U.S. PATENT DOCUMENTS

| | | | |
|---|---|---|---|
| 4,924,257 | 5/1990 | Jain ............................................ | 355/53 |
| 4,970,448 | 11/1990 | Torii et al. ............................ | 318/568.1 |
| 5,004,348 | 4/1991 | Magome ................................. | 356/401 |
| 5,202,695 | 4/1993 | Hollandsworth ......................... | 318/649 |
| 5,227,839 | 7/1993 | Allen ........................................ | 355/53 |
| 5,477,304 | 12/1995 | Nishi . | |
| 5,532,565 | 7/1996 | Vervoordeldonk ...................... | 318/610 |
| 5,568,032 | 10/1996 | Wakui ..................................... | 318/610 |
| 5,581,167 | 12/1996 | Kato et al. .............................. | 318/610 |

Primary Examiner—R. L. Moses
Assistant Examiner—Shival Virmani
Attorney, Agent, or Firm—Oliff & Berridge, PLC

[57] ABSTRACT

When the position of a stage is detected by interferometers, a converting means converts information detected by the interferometers into information on a position and a velocity of a center of gravity of the stage concerning each of degrees of freedom. PI controllers provided for each of the degrees of freedom determine control amounts for each of the degrees of freedom necessary for movement of the center of gravity by means of (proportional+integral) operation on the basis of velocity deviations in respective directions obtained as differences between values obtained by conversion into velocities from positional deviations of the center of gravity in the θ, Y, X directions and velocities of the center of gravity in the respective directions. Outputs of the respective controllers are inputted into a converting means which converts the input into control amounts to be generated in motors 12, 14, 16, 18 respectively, and give the control amounts after the conversion as command values to the respective motors. Mutual interference between control means is effectively avoided when the stage is driven by using driving devices of a number larger than the degrees of freedom. The stage apparatus may be applied to an exposure apparatus.

31 Claims, 5 Drawing Sheets

STAGE DRIVING EXPOSURE APPARATUS WHEREIN THE NUMBER OF DRIVING DEVICES EXCEEDS THE DEGREES OF FREEDOM OF THE STAGE

This is a Continuation of application Ser. No. 08/679,396 filed Jul. 9, 1996 now abandoned.

BACKGROUND OF THE INVENTION

1. Field of the Invention

The present invention relates to a stage driving and controlling apparatus. In particular, the present invention relates to a stage driving and controlling apparatus preferably used for driving and controlling a stage on which a substrate such as a wafer or a mask (or reticle) is placed in a measuring apparatus or an exposure apparatus used in a production step for producing semiconductors. The present invention also relates to an exposure apparatus provided with the stage driving and controlling apparatus.

2. Description of the Related Art

The position or the velocity of a stage in X and Y two-dimensional directions and a rotational direction about the Z axis (hereinafter referred to as "θ direction") has been hitherto controlled in an exposure apparatus or the like in order to position the stage at a predetermined position. FIG. 4 shows an example of a driving system for such a stage. In FIG. 4, a stage 80 is driven in the Y and θ directions by first and second motors 82, 84 and ball screw mechanisms 86, 88 driven by the motors 82, 84 respectively, and the stage 80 is driven in the X direction by a third motor 90 and a ball screw mechanism 92 driven by the motor 90. In this arrangement, positions of the stage 80 in the Y and θ directions are detected by a Yl laser interferometer (Yl INTERFERO.) 94 and a Yr laser interferometer(Yr INTERFERO.) 96, and a position of the stage 80 in the X direction is detected by an X laser interferometer (X INTERFERO.) 98.

FIG. 5 shows an arrangement of a stage driving and controlling apparatus for driving and controlling the stage 80. In FIG. 5, a θ position of center of gravity-calculating block (θ calculation) 100 is provided for converting positional information from the Yl laser interferometer 94 and the Yr laser interferometer 96 into an amount of rotation about the Z axis at a position of the center of gravity (positional information in the θ direction) and outputting the obtained result. Similarly, a Y position of center of gravity-calculating block (Y calculation) 102 is provided for converting positional information from the Yl laser interferometer 94 and the Yr laser interferometer 96 into positional information on the center of gravity in the Y direction and outputting the obtained result. An X position of center of gravity-calculating block (X calculation) 104 is provided for inputting positional information from the X laser interferometer 98 and the positional information on the center of gravity in the θ direction fed from the θ position of center of gravity-calculating block 100, converting the input into positional information on the center of gravity in the X direction, and outputting the obtained result. It is noted that so-called non-interfering calculation is performed in the three position of center of gravity-calculating blocks 100, 102, 104.

The pieces of positional information on the center of gravity outputted from the three position of center of gravity-calculating blocks 100, 102, 104 are used as primary feedback signals respectively, and they are compared with positional command values in the θ, Y, X directions (reference input signals for indicating target values) respectively. Positional deviations of the center of gravity in the θ, Y, X directions are inputted into three motor position-calculating conversion blocks (FIRST, SECOND and THIRD P-C BLOCKS) 106, 108, 110. The pieces of positional information on the center of gravity in the respective directions outputted from the three position of center of gravity-calculating blocks 100, 102, 104 are converted by differentiating circuits (DIF.) 112, 114, 116 into pieces of velocity information on the center of gravity in the θ, Y, X directions respectively, and they are fed to three motor velocity-calculating conversion blocks (FIRST, SECOND and THIRD V-C BLOCKS) 118, 120, 122.

The positional deviations of the center of gravity in the θ, Y, X directions are inputted into the first motor position-calculating conversion block 106, and they are converted into positional information at a position of the first motor 82. The positional information at the position of the first motor 82 is converted by a position gain 124 into a target value of velocity at the position of the first motor 82. The positional deviations of the center of gravity in the θ, Y, X directions are inputted into the second motor position-calculating conversion block 108, and they are converted into positional information at a position of the second motor 84. The positional information at the position of the second motor 84 is converted by a position gain 126 into a target value of velocity at the position of the second motor 84. The positional deviations of the center of gravity in the θ, Y, X directions are inputted into the third motor position-calculating conversion block 110, and they are converted into positional information at a position of the third motor 90. The positional information at the position of the third motor 90 is converted by a position gain 128 into a target value of velocity at the position of the third motor 90.

The pieces of velocity information on the center of gravity in the θ, Y, X directions are converted into velocity information at the position of the first motor 82 by the first motor velocity-calculating conversion block 118. The velocity information at the position of the first motor 82, which is used as an internal feedback signal, is compared with the target value of velocity at the position of the first motor 82. A difference between the both is used as an operation signal for a first controller 130. The pieces of velocity information on the center of gravity in the θ, Y, X directions are converted into velocity information at the position of the second motor 84 by the second motor velocity-calculating conversion block 120. The velocity information at the position of the second motor 84, which is used as an internal feedback signal, is compared with the target value of velocity at the position of the second motor 84. A difference between the both is used as an operation signal for a second controller 132. The pieces of velocity information on the center of gravity in the θ, Y, X directions are converted into velocity information at the position of the third motor 90 by the third motor velocity-calculating conversion block 122. The velocity information at the position of the third motor 90, which is used as an internal feedback signal, is compared with the target value of velocity at the position of the third motor 90. A difference between the both is used as an operation signal for a third controller 134.

The first, second, and third controllers 130, 132, 134 determine control amounts for the first, second, and third motors 82, 84, 90 respectively by means of proportional operation (P operation) or (proportional+integral) operation (PI operation). The determined control amounts are given as command values to the first, second, and third motors 82, 84, 90.

The P operation referred to herein is included in so-called basic control operations for controllers, which is specified in that an output signal is proportional to an operation signal (deviation), i.e., a control objective is operated in proportion to a deviation. The P operation is a basic control operation in feedback control. A transfer function G(s) of a controller which performs this control operation is represented by $G(s)=K_p$ provided that $K_p$ represents a proportional gain. The PI operation referred to herein is included in so-called basic control operations for controllers, which is specified as a control operation in which an output signal is a synthetic value of a control output proportional to a deviation as described above and a control output proportional to a time-integrated value of the deviation. A transfer function of a controller which performs this control operation is represented by $G(s)=K_p(1+1/T_I/s)$ provided that $T_I$ represents an integral time. The PI operation has been adopted in order to solve a problem that a steady-state deviation remains in the case of the use of only the P operation. Namely, in the case of control by using a control output obtained by adding an integrated value of the deviation (PI operation), even a slight deviation produces a large feedback output with the passage of time. Accordingly, the problem of the steady-state deviation is solved. The controller which performs the P operation is herein referred to as "P controller", and the controller which performs the PI operation is herein referred to as "PI controller".

The conventional apparatus for driving and controlling the stage having three degrees of freedom has controlled the system having three degrees of freedom without interference by converting the information incorporated from the laser interferometers as described above into the position and velocity of the center of gravity, followed by further conversion into the position and velocity at the positions of the motors to perform positional control and velocity control by using the P controllers or the PI controllers provided for each of the motors.

As for an exposure apparatus, especially an exposure apparatus of the full-area exposure system such as a so-called steppers, it is an extremely important task to improve the throughput. For this purpose, it is indispensable to increase the positioning velocity including the movement velocity of the stage. However, when the stage is driven by using a ball screw as described above, the rigidity of the ball screw sometimes becomes a factor to restrict positioning for the stage. Accordingly, a stage having higher rigidity is required. In order to respond to this request, for example, it is conceived that a stage (10) is driven in directions of three degrees of freedom by using four motors (12, 14, 16, 18) as shown in FIG. 2.

However, in the arrangement of the apparatus shown in FIG. 2, the number of the motors is larger than the degrees of freedom of the stage. Accordingly, if the conventional control system including the controllers arranged for each of the motors is used, it is feared that the following inconvenience arises. Namely, interference between the controllers takes place if any error occurs, such as conversion (non-interfering calculation) errors in the position of center of gravity-calculating blocks, the motor position-calculating conversion blocks, and the motor velocity-calculating conversion blocks resulting from mechanical attachment errors in respective components such as the interferometers, ball screws, and motors, control errors in the controllers, thrust errors in the motors, and uneven movement of the respective driving units. In such a situation, it is difficult to adjust the system, the control response is lowered, and a problem such as deterioration in robust characteristics arises. On the other hand, it is almost impossible to completely avoid the various types of errors as described above.

SUMMARY OF THE INVENTION

An object of the present invention is to dissolve the inconvenience involved in the conventional technique as described above, and provide a stage driving and controlling apparatus which can effectively avoid mutual interference between control means (controllers) when a stage is driven by using driving devices of a number larger than degrees of freedom of the stage, and an exposure apparatus including the stage driving and controlling apparatus.

According to a first aspect of the present invention, there is provided a stage apparatus comprising:

stage driving devices of a number larger than degrees of freedom of a stage;

position detectors for detecting positions of the stage;

a first converting means for converting information detected by the position detectors into information on at least one of a position and a velocity of a center of gravity of the stage concerning each of the degrees of freedom;

control means provided for each of the degrees of freedom for determining control amounts for each of the degrees of freedom necessary for movement of the center of gravity by means of proportional operation or (proportional+integral) operation on the basis of at least one of a positional deviation for each of the degrees of freedom obtained as a difference between a target position of the center of gravity for each of the degrees of freedom and the position of the center of gravity for each of the degrees of freedom converted by the first converting means and a velocity deviation for each of the degrees of freedom obtained as a difference between a target velocity of the center of gravity for each of the degrees of freedom and the velocity of the center of gravity for each of the degrees of freedom converted by the first converting means; and a second converting means for converting the control amounts for each of the degrees of freedom determined by the control means into control amounts for controlling the driving devices.

According to the stage apparatus of the present invention, when the positions of the stage is detected by the position detectors, the first converting means converts the information detected by the position detectors into the information on at least one of the position and the velocity of the center of gravity of the stage concerning each of the degrees of freedom. The operation of conversion into the information on at least one of the position and the velocity of the center of gravity of the stage concerning each of the degrees of freedom herein refers to any one of operations conducted by the first converting means, including an operation for converting the information detected by the position detectors into the information on the position of the center of gravity of the stage concerning each of the degrees of freedom, an operation for converting the information detected by the position detectors into the information on the velocity of the center of gravity of the stage concerning each of the degrees of freedom, and an operation for converting the information detected by the position detectors into the information on the position of the center of gravity of the stage concerning each of the degrees of freedom and the information on the velocity of the center of gravity of the stage concerning each of the degrees of freedom. When the information detected by the position detectors is converted by the first converting means into the information on the position of the center of gravity of the stage concerning each of the degrees of freedom, the control means provided for each of the degrees of freedom determine the control amounts for each of the degrees of freedom necessary for movement of the center of gravity by means of the proportional operation or the (proportional+integral) operation on the basis of the positional deviation for each of the degrees of freedom obtained as the difference between the target position of the center of gravity for each of the degrees of freedom and the position of the center of gravity for each of the degrees of freedom converted by the first converting means. When the information detected by the position detectors is converted by the first converting means into the information on the velocity of the center of gravity of the stage concerning each of the degrees of freedom, the control means provided for each of the degrees of freedom determine the control amounts for each of the degrees of freedom necessary for movement of the center of gravity by means of the P (proportional) operation or the PI (proportional+integral) operation on the basis of the velocity deviation for each of the degrees of freedom obtained as the difference between the target velocity of the center of gravity for each of the degrees of freedom and the velocity of the center of gravity for each of the degrees of freedom converted by the first converting means. When the information detected by the position detectors is converted by the first converting means into the information on the position of the center of gravity of the stage concerning each of the degrees of freedom and the information on the velocity of the center of gravity of the stage concerning each of the degrees of freedom, the control means provided for each of the degrees of freedom determine the control amounts for each of the degrees of freedom necessary for movement of the center of gravity by means of the P operation or the PI operation on the basis of both of or any one of the positional deviation and the velocity deviation of the center of gravity for each of the degrees of freedom. Outputs of all of the control means provided for each of the degrees of freedom are inputted into the second converting means which converts them into the control amounts to be generated for each of the driving devices. The control amounts after the conversion are given as command values to the respective driving devices. Thus the respective driving devices are driven in response to the respective command values.

It is preferable that the control means provided for each of the degrees of freedom determines the control amount for each of the degrees of freedom necessary for the movement of the center of gravity by means of the (proportional+ integral) operation on the basis of a difference between a value obtained by conversion into velocity from the positional deviation of the center of gravity for each of the degrees of freedom and the velocity of the center of gravity for each of the degrees of freedom converted by the first converting means. According to this embodiment, the control means provided for each of the degrees of freedom determine the control amounts for each of the degrees of freedom necessary for the movement of the center of gravity by means of the PI operation on the basis of the difference between the value obtained by conversion into velocity from the positional deviation of the center of gravity for each of the degrees of freedom and the velocity of the center of gravity for each of the degrees of freedom converted by the first converting means. Accordingly, a type 1 velocity control loop can be constructed as an internal loop existing in a position control loop. Namely, the position loop can be constructed outside the velocity control loop while compensating steady-state characteristics by the aid of the velocity control loop.

It is preferable that the first converting means comprises a system for compensating delay time. Owing to the system for compensating delay time possessed by the first converting means, even if time delay arises, for example, due to the time required for non-interfering calculation or the like performed for conversion into the position of the center of gravity when the apparatus principally comprises a digital control system, it is possible to compensate the time delay so that the control response may be improved.

It is effective that the stage apparatus of the present invention has three degrees of freedom in X, Y, and θ directions, and it has two driving devices for moving the stage in the X direction and two driving devices for moving the stage in the Y direction. Those usable as the stage driving device include a linear motor, a combination of a rotary motor and a ball screw element, and a piezoelectric element.

According to a second aspect of the present invention, there is provided an exposure apparatus for transferring a pattern formed on a mask onto a photosensitive substrate through a projection optical system, comprising:

an illuminating optical system for illuminating the mask;
a mask stage for placing the mask thereon; and
a substrate stage for holding the photosensitive substrate and movable in two-dimensional directions; wherein
at least one of the mask stage and the substrate stage is a stage apparatus comprising:
stage driving devices of a number larger than degrees of freedom of the stage;
position detectors for detecting positions of the stage;
a first converting means for converting information detected by the position detectors into information on at least one of a position and a velocity of a center of gravity of the stage concerning each of the degrees of freedom;
control means provided for each of the degrees of freedom for determining control amounts for each of the degrees of freedom necessary for movement of the center of gravity by means of proportional operation or (proportional+ integral) operation on the basis of at least one of a positional deviation for each of the degrees of freedom obtained as a difference between a target position of the center of gravity for each of the degrees of freedom and the position of the center of gravity for each of the degrees of freedom converted by the first converting means and a velocity deviation for each of the degrees of freedom obtained as a difference between a target velocity of the center of gravity for each of the degrees of freedom and the velocity of the center of gravity for each of the degrees of freedom converted by the first converting means; and
a second converting means for converting the control amounts for each of the degrees of freedom determined by the control means into control amounts for controlling the driving devices. The exposure apparatus can be provided as a scanning type exposure apparatus such as those of the step-and-scan type or a full-area exposure type exposure apparatus of the step-and-scan type.

DETAILED DESCRIPTION OF PREFERRED EMBODIMENTS

An embodiment of the present invention will be explained below with reference to FIGS. 1 and 2, however, the present invention is not limited thereto.

Figure 2:
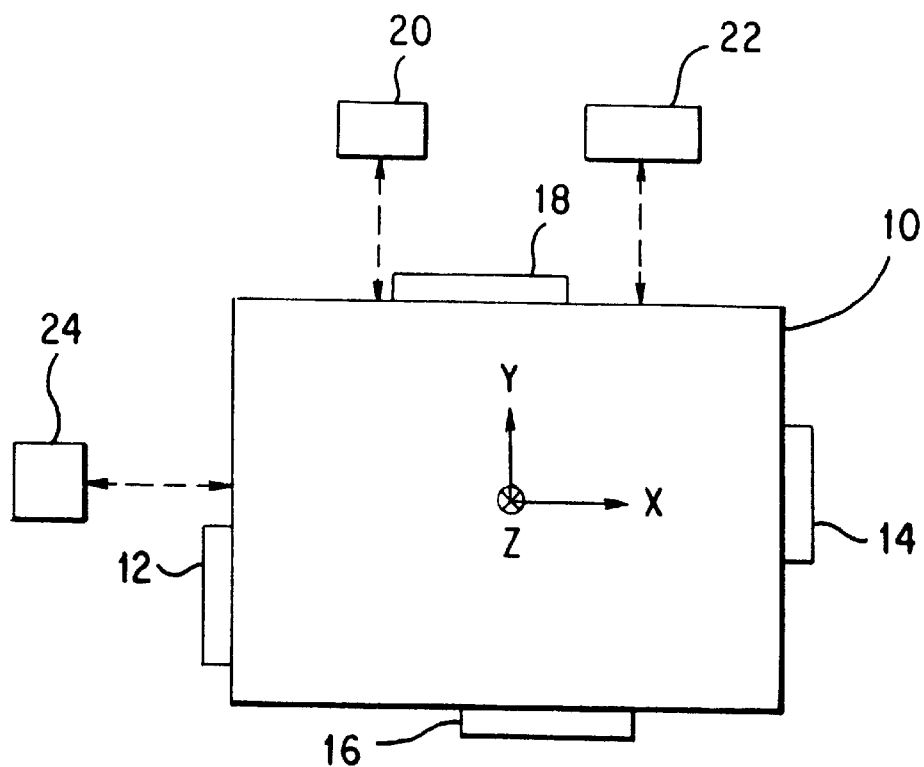
FIG. 2 shows a plan view illustrating an arrangement of a stage driving system controlled by the apparatus shown in FIG. 1.

FIG. 2 shows a driving system for a stage 10 according to the embodiment. The stage 10 is arranged such that it is movable in X, Y two-dimensional directions, and rotatable about the Z axis in FIG. 2. Namely, the stage 10 has three degrees of freedom of X, Y, θ.

First and second linear motors 12, 14 are provided on one end surface and the other end surface of the stage 10 in the X axis direction, which serve as driving devices for driving the stage 10 in the Y axis direction respectively. The first and second linear motors 12, 14 are disposed at positions displaced by predetermined amounts on one side and the other side in the Y direction respectively with respect to the X axis passing through a center of gravity of the stage 10. Third and fourth linear motors 16, 18 are provided on one end surface and the other end surface of the stage 10 in the Y direction, which serve as driving devices for driving the stage 10 in the X axis direction respectively. The third and fourth linear motors 16, 18 are disposed at positions displaced by predetermined amounts on one side and the other side in the X direction respectively with respect to the Y axis passing through the center of gravity of the stage 10.

Therefore, the stage 10 is driven in the Y axis direction when the third and fourth linear motors 16, 18 have a thrust force of zero, and the first and second linear motors 12, 14 have an equal thrust force. On the contrary, the stage 10 is driven in the X axis direction when the first and second linear motors 12, 14 have a thrust force of zero, and the third and fourth linear motors 16, 18 have an equal thrust force. When the sum total of moments about the center of gravity of thrust forces of the first to fourth linear motors 10 to 18 is other than zero, the stage 10 is driven in the θ direction depending on the sum total of moments (the stage 10 is rotated and driven about the Z axis which passes through the center of gravity). Positions of the stage 10 in the Y, θ directions are detected by a Yl laser interferometer 20 and a Yr laser interferometer 22 which serve as position detectors. A position of the stage 10 in the X direction is detected by an X laser interferometer 24 which serves as a position detector.

Figure 1:
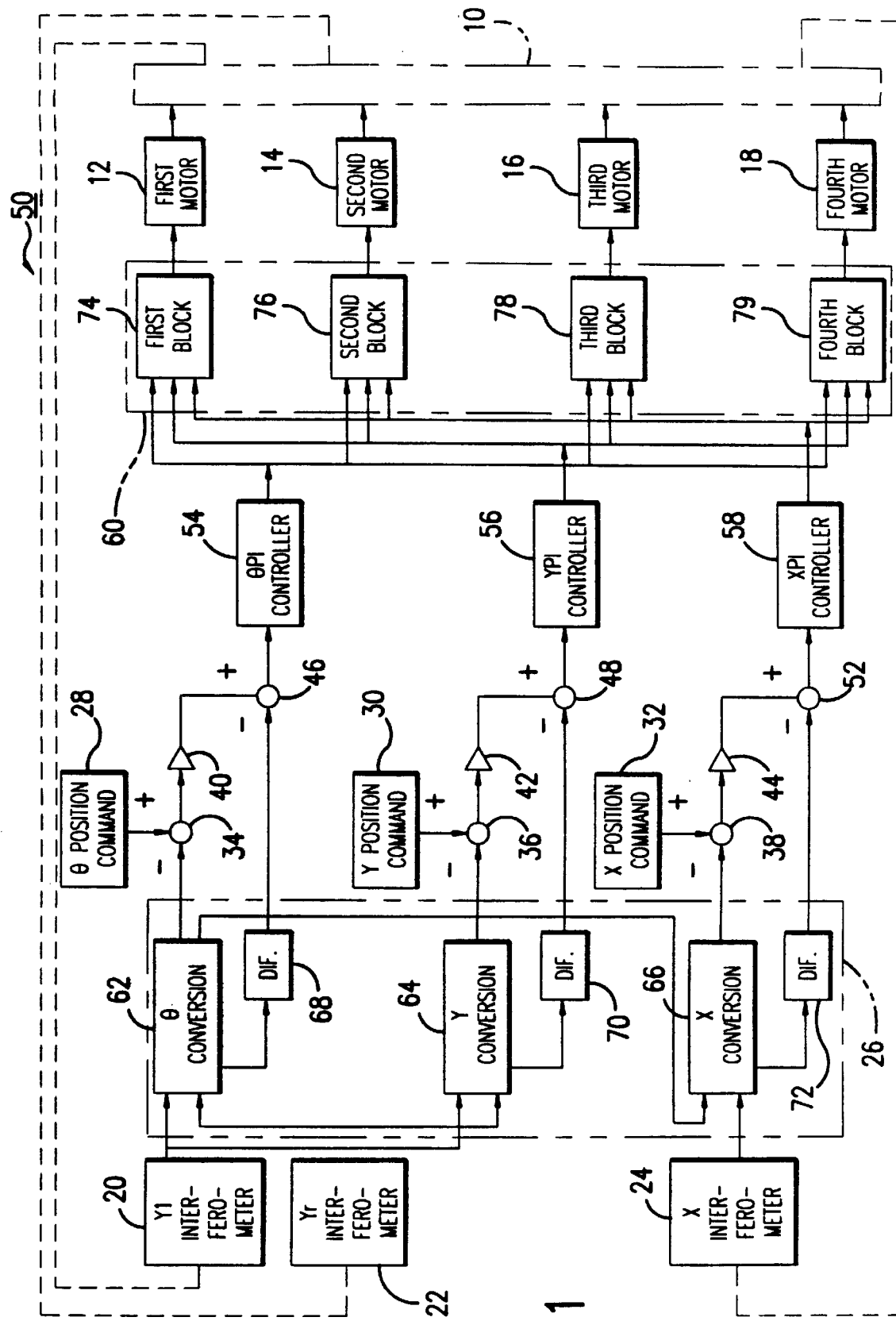
FIG. 1 shows a block diagram illustrating an arrangement of a stage driving and controlling apparatus according to an embodiment of the present invention.

FIG. 1 shows an arrangement of a stage driving and controlling apparatus 50 for controlling the movement position of the stage 10. The stage driving and controlling apparatus 50 comprises the three laser interferometers 20, 22, 24, a first converting means 26 for converting positional information detected by the laser interferometers 20, 22, 24 into positional information and velocity information on the center of gravity of the stage 10 for each of the degrees of freedom, three position-commanding sections 28, 30, 32 for giving commands for target positions of the center of gravity for each of the degrees of freedom, three arithmetic circuits 34, 36, 38 for calculating positional deviations for each of the degrees of freedom as differences between the target positions of the center of gravity for each of the degrees of freedom and positions of the center of gravity for each of the degrees of freedom obtained by conversion by the first converting means 26, three position-velocity converting gains 40, 42, 44 for converting the positional deviations for each of the degrees of freedom calculated by the arithmetic circuits 34, 36, 38 into values obtained by conversion into velocities from the positional deviations, three arithmetic circuits 46, 48, 52 for calculating differences between the values obtained by conversion into velocities from the positional deviations of the center of gravity for each of the degrees of freedom and velocities of the center of gravity for each of the degrees of freedom obtained by conversion by the first converting means 26, three PI controllers 54, 56, 58 provided as control means for each of the degrees of freedom for determining control amounts for each of the degrees of freedom necessary for movement of the center of gravity on the basis of outputs of the arithmetic circuits 46, 48, 52, and a second converting means 60 for inputting the outputs of the three PI controllers 54, 56, 58 thereinto, converting them into control amounts to be generated by the four linear motors 12, 14, 16, 18 respectively, and giving the control amounts after the conversion as command values to the respective linear motors 12, 14, 16, 18.

The first converting means 26 comprises a θ position of center of gravity-calculating conversion block (θ conversion) 62 for simultaneously inputting the positional information detected by the Yl laser interferometer 20 and the Yr laser interferometer 22 respectively thereinto and converting the input into a position (amount of rotation) in the θ direction at the position of the center of gravity of the stage, a Y position of center of gravity-calculating conversion block (Y conversion) 64 for simultaneously inputting the positional information detected by the Yl laser interferometer 20 and the Yr laser interferometer 22 respectively thereinto and converting the input into a position of the center of gravity of the stage in the Y direction, an X position of center of gravity-calculating conversion block (X conversion) 66 for inputting the positional information detected by the X laser interferometer 24 and the positional information in the θ direction at the position of the center of gravity of the stage obtained by the conversion by the conversion block 62 thereinto and converting the input into a position of the center of gravity of the stage in the X direction, and differentiating circuits (DIF.) 68, 70, 72 for differentiating the positional information on the center of gravity in the θ direction, the positional information in the Y direction, and the positional information in the X direction outputted from the three conversion blocks 62, 64, 66 respectively and converting obtained results into velocity information.

The second converting means 60 comprises a first motor command-calculating conversion block (FIRST BROCK) 74, a second motor command-calculating conversion block (SECOND BROCK) 76, a third motor command-calculating conversion block (THIRD BROCK) 78, and a fourth motor command-calculating conversion block (FOURTH BROCK) 79 for simultaneously inputting control amounts calculated by a θPI controller 54, YPI controller 56, and XPI controller 58 thereinto, converting the input into control amounts to be generated by the fist linear motor 12, the second linear motor 14, the third linear motor 16, and the fourth linear motor 18 respectively, and giving the control amounts after the conversion as command values to the linear motors 12, 14, 16, 18 respectively.

Next, the operation of the stage driving and controlling apparatus 50 arranged as described above will be explained. The θ position of center of gravity-calculating conversion block 62 converts the positional information from the Yl laser interferometer 20 and the Yr laser interferometer 22 by means of non-interfering calculation into positional information on the center of gravity in the θ direction, and outputs the obtained result. Similarly, the Y position of center of gravity-calculating conversion block 64 converts the positional information from the Yl laser interferometer 20 and the Yr laser interferometer 22 by means of non-interfering calculation into positional information on the center of gravity in the Y direction, and outputs the obtained result. The positional information from the X laser interferometer 24 and the positional information on the center of gravity in the θ direction fed from the conversion block 62 are inputted into the X position of center of gravity-calculating conversion block 66, which are converted by means of non-interfering calculation into positional information on the center of gravity in the X direction, and the obtained result is outputted.

The pieces of the positional information on the center of gravity outputted from the three position of center of gravity-calculating conversion blocks 62, 64, 66 are used as primary feedback signals respectively, which are inputted into the arithmetic circuits 34, 36, 38. The arithmetic circuit 34 calculates a positional deviation of the center of gravity in the θ direction as a difference between a target position of the center of gravity in the θ direction fed from the θ position-commanding section 28 and the position of the center of gravity in the θ direction fed from the conversion block 62. Similarly, the arithmetic circuit 36 calculates a positional deviation of the center of gravity in the Y direction as a difference between a target position of the center of gravity in the Y direction fed from the Y position-commanding section 30 and the position of the center of gravity in the Y direction fed from the conversion block 64. Similarly, the arithmetic circuit 38 calculates a positional deviation of the center of gravity in the X direction as a difference between a target position of the center of gravity in the X direction fed from the X position-commanding section 32 and the position of the center of gravity in the X direction fed from the conversion block 66. The positional deviations of the center of gravity in the θ, Y, X directions calculated by the arithmetic circuits 34, 36, 38 respectively are converted by the position gains 40, 42, 44 into target values of velocities in the θ, Y, X directions respectively.

The positional information on the center of gravity in the θ direction, the positional information in the Y direction, and the positional information in the X direction outputted from the conversion blocks 62, 64, 66 are converted by the differentiating circuits 68, 70, 72 into velocity information on the center of gravity in the θ direction, velocity information in the Y direction, and velocity information in the X direction respectively. The pieces of the velocity information are inputted as internal feedback signals into the arithmetic circuits 46, 48, 52. The arithmetic circuit 46 calculates a difference between the target value of velocity in the θ direction and the velocity information on the center of gravity in the θ direction fed from the differentiating circuit 68. The difference is given as an operation signal to the θPI controller 54. Similarly, the arithmetic circuit 48 calculates a difference between the target value of velocity in the Y direction and the velocity information on the center of gravity in the Y direction fed from the differentiating circuit 70. The difference is given as an operation signal to the YPI controller 56. Similarly, the arithmetic circuit 52 calculates a difference between the target value of velocity in the X direction and the velocity information on the center of gravity in the X direction fed from the differentiating circuit 72. The difference is given as an operation signal to the XPI controller 58.

The θPI controller 54 determines a control amount in the θ direction necessary for movement of the center of gravity in accordance with the PI operation on the basis of the operation signal, and it outputs the obtained result to the four conversion blocks 74, 76, 78, 79 which constitute the second converting means 60. Similarly, the YPI controller 56 determines a control amount in the Y direction necessary for movement of the center of gravity in accordance with the PI operation on the basis of the operation signal, and it outputs the obtained result to the four conversion blocks 74, 76, 78, 79 which constitute the second converting means 60. Similarly, the XPI controller 58 determines a control amount in the X direction necessary for movement of the center of gravity in accordance with the PI operation on the basis of the operation signal, and it outputs the obtained result to the four conversion blocks 74, 76, 78, 79 which constitute the second converting means 60.

The control amounts in the respective directions fed from the three PI controllers 54, 56, 58 are inputted into the first motor command-calculating conversion block 74, which are converted by means of non-interfering calculation into a control amount to be generated in the first linear motor 12. The control amount after the conversion is given as a command value to the first linear motor 12. Similarly, the control amounts in the respective directions fed from the three PI controllers 54, 56, 58 are inputted into the second motor command-calculating conversion block 76, which are converted by means of non-interfering calculation into a control amount to be generated in the second linear motor 14. The control amount after the conversion is given as a command value to the second linear motor 14. The control amounts in the respective directions fed from the three PI controllers 54, 56, 58 are inputted into the third motor command-calculating conversion block 78, which are converted by means of non-interfering calculation into a control amount to be generated in the third linear motor 16. The control amount after the conversion is given as a command value to the third linear motor 16. The control amounts in the respective directions fed from the three PI controllers 54, 56, 58 are inputted into the fourth motor command-calculating conversion block 79, which are converted by means of non-interfering calculation into a control amount to be generated in the fourth linear motor 18. The control amount after the conversion is given as a command value to the fourth linear motor 18.

Accordingly, the first, second, third, and fourth linear motors 12 to 18 are driven in response to the respective command values. Thus the first, second, third, and fourth linear motors 12 to 18 are subjected to feedback control, and the stage 10 is positioned at the target position (θ, X, Y).

As explained above, according to this embodiment which is different from the conventional technique, the PI controllers are provided for each of the degrees of freedom to determine the control amounts for each of the degrees of freedom. After that, the control amounts for each of the degrees of freedom are converted into the control amounts to be generated in the respective linear motors 12 to 18, and the obtained results are given as the command values to the respective linear motors 12 to 18. Accordingly, mutual interference between the PI controllers scarcely takes place even if any error occurs, such as errors in the non-interfering calculation by the first converting means 26 and the second converting means 60 resulting from mechanical attachment errors in the interferometers, motors, etc., control errors in the controllers, thrust errors in the linear motors, and uneven movement of the respective driving units. Thus it is possible to obtain various effects such as simplified adjustment, improved control response, improved robust characteristics, and easy optimum adjustment for each of the degrees of freedom.

The foregoing embodiment has exemplified the arrangement in which the internal feedback loop for the velocity is configured inside the feedback loop for the position, and the positional information detected by the laser interferometers is converted by the first converting means 26 into the positional information and the velocity information on the center of gravity corresponding thereto. However, the present invention is not limited to the foregoing arrangement. For example, when the internal feedback loop for the velocity is not provided, it is sufficient for the first converting means 26 to only convert the positional information detected by the laser interferometers into the positional information on the center of gravity. Alternatively, the velocity of the center of gravity of the stage may be used as the target value because control of the velocity of the stage is substantially equivalent to control of the position. In such an arrangement, it is allowable that only a feedback loop for the velocity is configured as the feedback loop, and the first converting means 26 converts the positional information detected by the laser interferometers into only the velocity information on the center of gravity.

The position detector is also not limited to the laser interferometers exemplified in the foregoing embodiment. Alternatively, for example, it is possible to use an encoder or the like as the position detector.

The foregoing embodiment has exemplified the arrangement in which the linear motors are used as the driving device. This arrangement is provided because the linear motor is advantageous from a viewpoint of rigidity as compared with a conventional combination of a rotary motor and a ball screw. It is a matter of course that the present invention is not limited to this arrangement. Therefore, it is allowable to use, as the driving device, a combination of a rotary motor and a ball screw and a thrust force-generating means such as a piezoelectric element.

The foregoing embodiment has exemplified the arrangement in which the PI controllers as the control means are provided for each of the degrees of freedom. However, P controllers as the control means may be provided for each of the degrees of freedom provided that the steady-stage deviation can be made sufficiently small only by increasing the proportional gain, and there is no fear of hunting resulting from any delay in the control system.

The stage driving and controlling apparatus described above may be realized by using either an analog control system or a digital control system. However, in the case of the digital control system, it is desirable to perform compensation for delay caused by any CPU processing.

Figure 3:
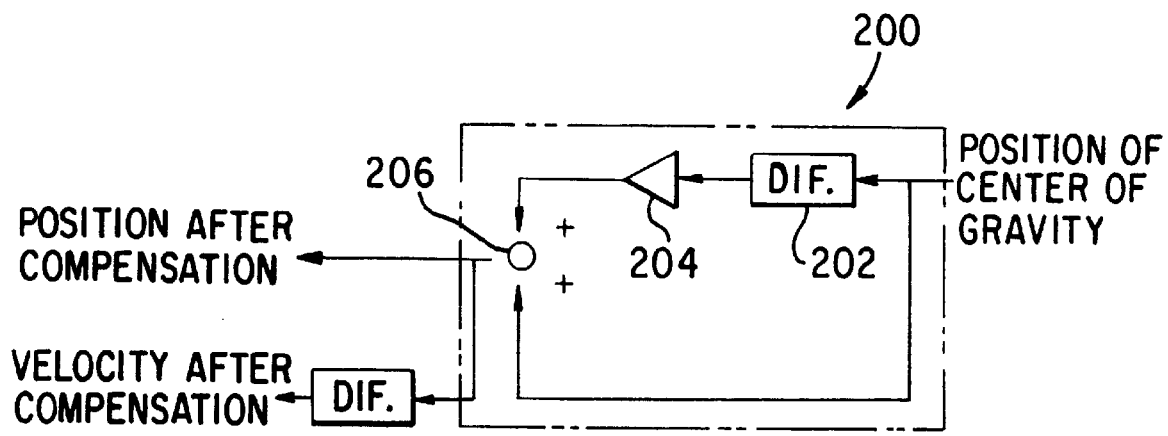
FIG. 3 shows an exemplary arrangement of a time delay-compensating system.
Figure 4:
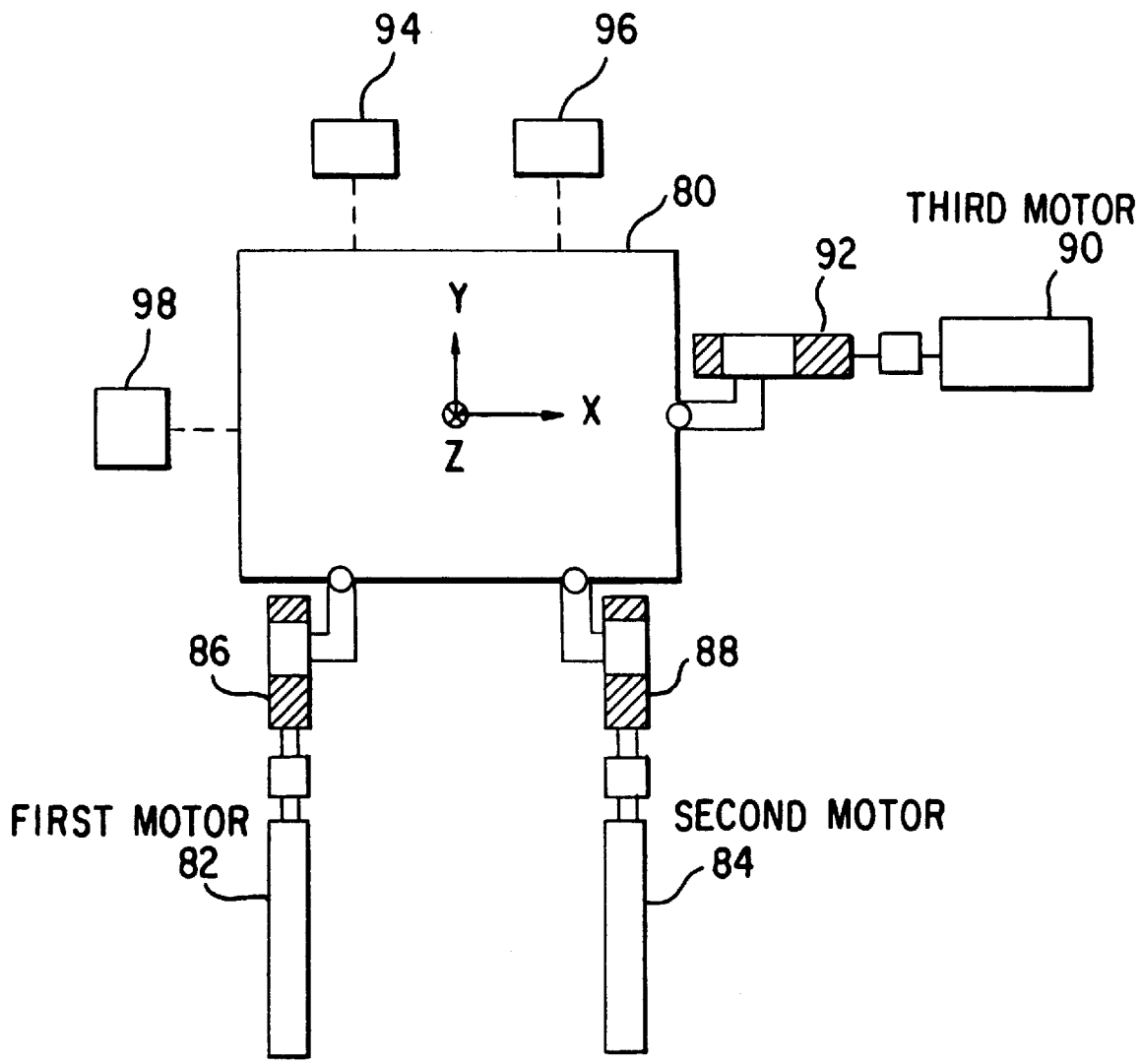
FIG. 4 shows a plan view illustrating an arrangement of a conventional stage driving system.
Figure 5:
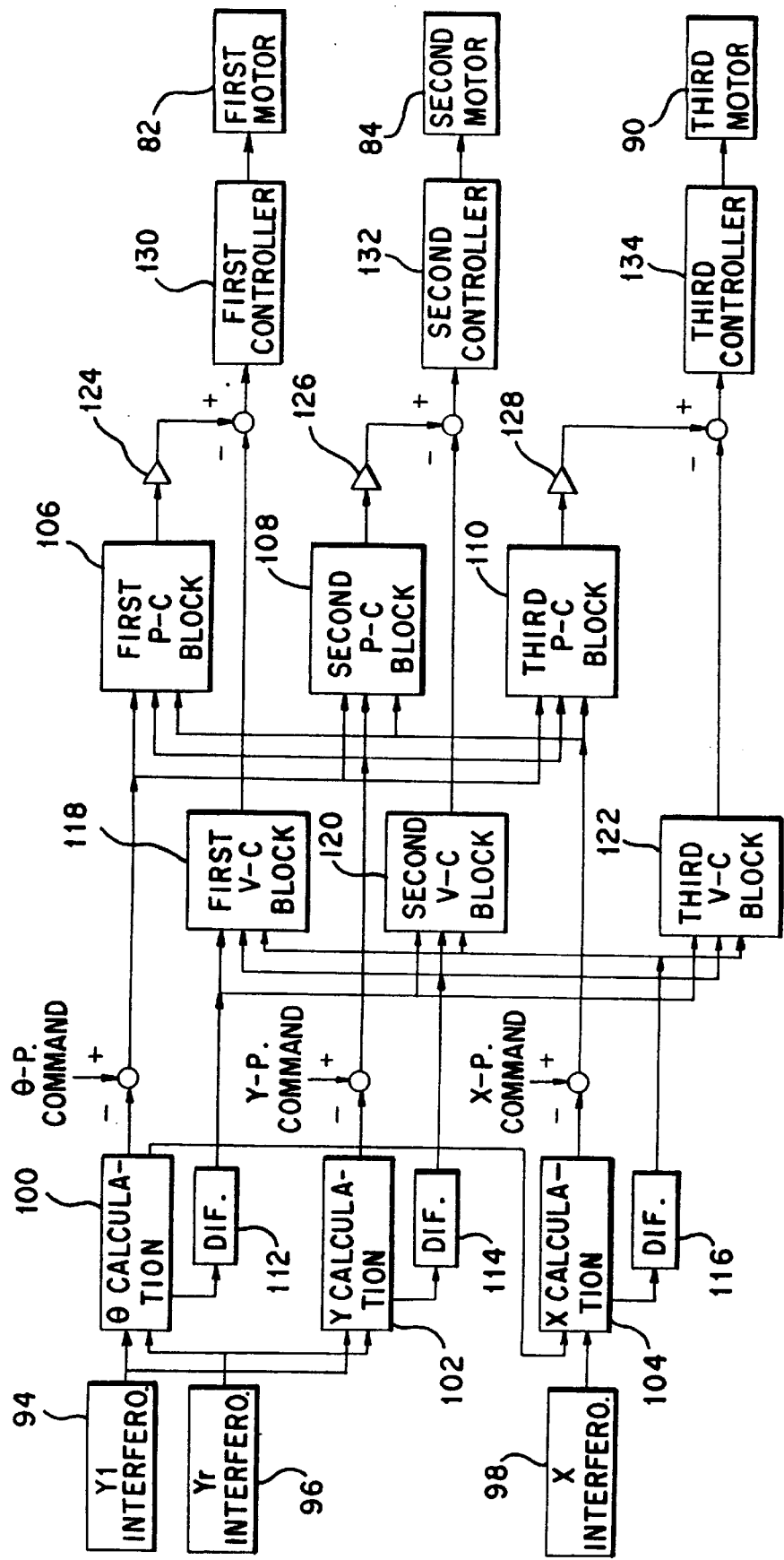
FIG. 5 shows a block diagram illustrating an arrangement of a conventional stage driving and controlling apparatus.

FIG. 3 shows an example of a delay time-compensating system. The delay time-compensating system 200 is actually arranged at exits of the conversion blocks 62, 64, 66 which constitute the first converting means 26. The time delay-compensating system 200 comprises a differentiating circuit 202, a delay time gain 204, and an arithmetic circuit (adding point) 206. According to this arrangement, the inputted positional information on the center of gravity is converted by the differentiating circuit 202 into velocity information. The velocity information passes through the delay time gain 204, and thus it is converted into information on a distance of movement of the stage during the delay time. The information on the distance of movement of the stage and the inputted positional information on the center of gravity are added by the arithmetic circuit 206. Namely, according to the delay time-compensating system 200, even if the time delay arises due to a period of time required for, for example, the non-interfering calculation to make conversion into the position of the center of gravity, the position of the center of gravity is calculated as a position obtained by adding the estimated distance of movement of the stage during the delay time. Accordingly, the time delay is consequently compensated, and it is possible to improve control response.

The foregoing embodiment has explained the arrangement in which the controller exists at the position of the center of gravity. However, the present invention may be applied such that the controller is installed at any arbitrary position other than the position of the center of gravity by regulating the coefficient for the non-interfering calculation.

For example, in the case of a reticle fine movement state in a wafer exposure apparatus, the center of gravity of the reticle fine movement stage is not important, but the position of a reticle center is important. In such a case, the following methods are assumed. Namely, in one method, the reticle center is subjected to coordinate conversion into the center of gravity of the reticle fine movement stage so that control is performed by using a controller placed at the position of the center of gravity. In another method, the position is read by using an interferometer, followed by calculation and processing by using CPU up to a step of calculation of control amounts for respective motors assuming that the center of gravity is entirely located on the reticle center. In the case of the latter method, the controller may be installed at any arbitrary position other than the position of the center of gravity.

Figure 6:
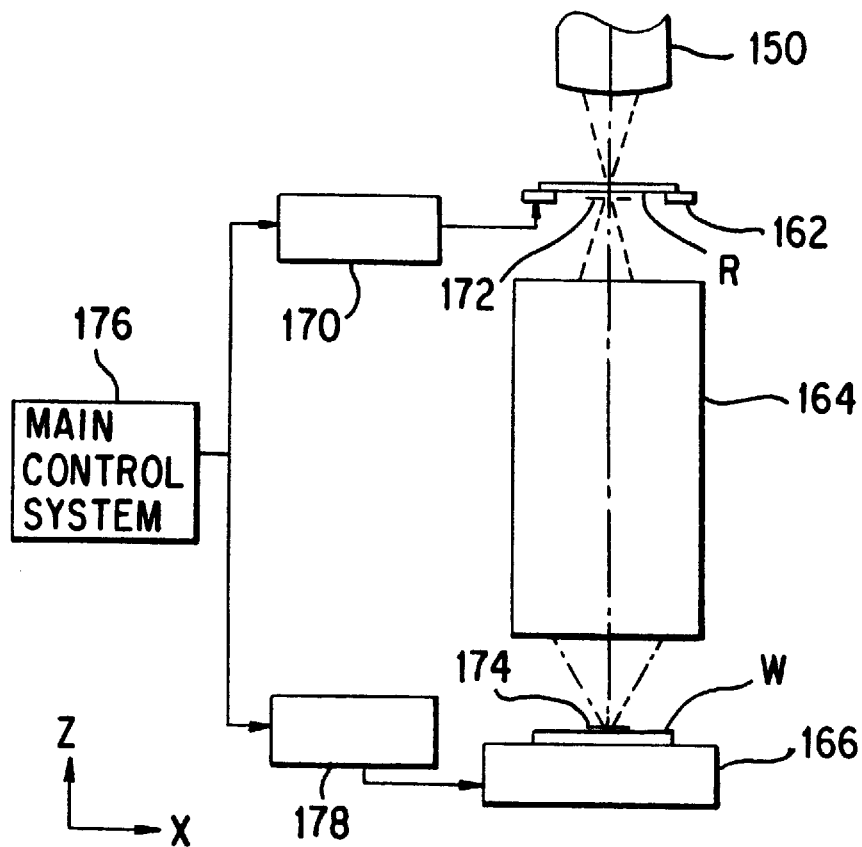
FIG. 6 shows an exemplary arrangement of a step-and-scan type exposure apparatus to which the stage apparatus of the present invention is applied.

FIG. 6 shows a schematic arrangement of a projection exposure apparatus to which the stage apparatus of the present invention is applied. The projection exposure apparatus principally comprises an illuminating optical system 150 including a light source for radiating illumination light, a reticle stage 162 for scanning a reticle R, a projection optical system 164 for projecting a reticle pattern onto a wafer W, and a wafer stage 166 for moving the wafer W two-dimensionally. Those usable as the light source of the illuminating optical system 150 include excimer laser light sources such as ArF excimer laser, metal vapor laser light sources, pulse light source of YAG laser, and continuous light such as bright line (for example, i-ray) emitted from mercury lamp. The illuminating optical system 150 comprises, in addition to the light source, a beam-shaping optical system composed of a cylindrical lens and a beam expander, a fly's eye lens, a condenser lens, a field diaphragm, and a relay lens. The light radiated onto the reticle R by the illuminating optical system 150 is uniformalized. The illumination light is restricted to be slit-shaped on the reticle R by the unillustrated field diaphragm in the illuminating optical system 150.

The reticle stage 162 for placing the reticle R thereon is driven by a reticle stage-driving unit 170 so that the reticle R is moved in a scanning direction (Y direction (or −Y direction) in FIG. 6). The reticle stage 162 can also move the reticle R in a direction (X direction or −X direction in FIG. 6) perpendicular to the scanning direction. The stage apparatus of the present invention shown in FIGS. 1 and 2 can be used for the reticle stage 162.

The wafer W is exposed by projection with a pattern image of a slit-shaped illumination area on the reticle R through the projection optical system 164. The wafer W is placed on the wafer stage 166. A slit-shaped exposure area 174, which is conjugate to the slit-shaped illumination area 162, is formed on the wafer W. The wafer stage 166 positions the wafer W in a plane perpendicular to an optical axis of the projection optical system 164, and it scans the wafer W in the ±Y directions. The wafer stage 166 can make stepping in the X or −X direction in order to make movement to another shot area. The stage apparatus of the present invention shown in FIGS. 1 and 2 can be used for the substrate stage 166. A main control system 176 controls positioning operation and scanning operation of the wafer stage 166 through a wafer stage-driving unit 178. The operation of the reticle stage-driving unit 170 is also under the control of the main control system 176 which controls the operation of the entire apparatus.

In the arrangement of the apparatus as described above, when each of the shot areas on the wafer W is exposed with the pattern image on the reticle R through the projection optical system 164 in accordance with the step-and-scan system, the reticle R is scanned by using the reticle stage 162 in the Y direction (or −Y direction) with respect to the slit-shaped illumination area 172. The wafer W is scanned in synchronization with the scanning for the reticle R in the −Y direction (or Y direction) by using the wafer stage 166 with respect to the slit-shaped exposure area 174 conjugate to the slit-shaped illumination area 162. The circuit pattern image on the reticle R is successively transferred onto each of the shot areas on the wafer W by synchronously scanning the reticle R and the wafer W as described above.

The foregoing embodiment has exemplified the arrangement in which the stage apparatus of the present invention is applied to the exposure apparatus of the step-and-scan type. However, the present invention is not limited to the projection exposure apparatus of the step-and-scan type. The present invention can be also applied to a projection exposure apparatus of the step-and-repeat type, and exposure apparatuses of the contact system and the proximity system. The present invention is not limited to the embodiment described above. The present invention can be constructed in other various forms within a range not deviating from the spirit of the present invention.

As explained above, according to the present invention, the control amounts for each of the degrees of freedom necessary for the movement of the center of gravity are determined by the control means for performing the P operation or the PI operation for each of the degrees of freedom. Accordingly, an excellent effect, which has not been achieved by the conventional technique, is obtained in that mutual interference between the control means scarcely takes place even if any error occurs, such as errors in the non-interfering calculation during the process from the reading of the position to the calculation of the motor control amounts resulting from mechanical attachment errors in the position detectors such as the interferometers and the driving devices such as the motors, control errors in the control means, thrust errors in the driving devices, and uneven movement of the respective driving units. Therefore, the mask pattern can be transferred onto the predetermined position on the photosensitive substrate more accurately by using the stage apparatus of the present invention for the exposure apparatus. It is especially effective to apply the stage apparatus of the present invention to the mask stage and the substrate stage used for the exposure apparatus of the step-and-scan type in which the both stages are moved synchronously.

The present invention may be practiced or embodied in other various forms without departing from the spirit or essential characteristics thereof. It will be understood that the scope of the present invention is indicated by the appended claims, and all variations and modifications concerning, for example, the type or form of the feedback loop, the position detector, the driving device, the controller, and the control system, the position of the controller, and the type of the exposure apparatus, which come within the equivalent range of the claims, are embraced in the scope of the present invention.

What is claimed is:

1. A stage apparatus comprising:

stage driving devices of a number larger than degrees of freedom of a stage;

position detectors for detecting positions of the stage;

a first converting means for converting information detected by the position detectors into information on at least one of a position and a velocity of a center of gravity of the stage concerning each of the degrees of freedom;

control means provided for each of the degrees of freedom for determining control amounts for each of the degrees of freedom necessary for movement of the center of gravity by means of proportional operation or (proportional+integral) operation on the basis of at least one of a positional deviation for each of the degrees of freedom obtained as a difference between a target position of the center of gravity for each of the degrees of freedom and the position of the center of gravity for each of the degrees of freedom converted by the first converting means and a velocity deviation for each of the degrees of freedom obtained as a difference between a target velocity of the center of gravity for each of the degrees of freedom and the velocity of the center of gravity for each of the degrees of freedom converted by the first converting means; and a second converting means for converting the control amounts for each of the degrees of freedom determined by the control means into control amounts for controlling the driving devices.

2. The stage apparatus according to claim 1, wherein the second converting means is provided as a converting device, connected to the respective driving devices, for converting the control amounts for each of the degrees of freedom determined by the control means provided for each of the degrees of freedom into command values for controlling the respective driving devices.

3. The stage apparatus according to claim 1, wherein the control means provided for each of the degrees of freedom determines the control amount for each of the degrees of freedom necessary for the movement of the center of gravity by means of the (proportional+integral) operation on the basis of a difference between a value obtained by conversion into velocity from the positional deviation of the center of gravity for each of the degrees of freedom and the velocity of the center of gravity for each of the degrees of freedom converted by the first converting means.

4. The stage apparatus according to claim 1, wherein the stage has three degrees of freedom in X, Y, and θ directions, and it has two driving devices for moving the stage in the X direction and two driving devices for moving the stage in the Y direction.

5. The stage apparatus according to claim 1, wherein the stage driving device is selected from the group consisting of a linear motor, a combination of a rotary motor and a ball screw element, and a piezoelectric element.

6. The stage apparatus according to claim 1, wherein the first converting means comprises a system for compensating delay time.

7. An exposure apparatus for transferring a pattern formed on a mask onto a photosensitive substrate through a projection optical system, comprising:

an illuminating optical system for illuminating the mask;

a mask stage for placing the mask thereon; and a substrate stage for holding the photosensitive substrate and movable in two-dimensional directions, wherein at least one of the mask stage and the substrate stage is a stage apparatus, the stage apparatus comprising:

stage driving devices of a number larger than degrees of freedom of the stage;

position detectors for detecting positions of the stage;

a first converting means for converting information detected by the position detectors into information on at least one of a position and a velocity of a center of gravity of the stage concerning each of the degrees of freedom;

control means provided for each of the degrees of freedom for determining control amounts for each of the degrees of freedom necessary for movement of the center of gravity by means of proportional operation or (proportional+integral) operation on the basis of at least one of a positional deviation for each of the degrees of freedom obtained as a difference between a target position of the center of gravity for each of the degrees of freedom and the position of the center of gravity for each of the degrees of freedom converted by the first converting means and a velocity deviation for each of the degrees of freedom obtained as a difference between a target velocity of the center of gravity for each of the degrees of freedom and the velocity of the center of gravity for each of the degrees of freedom converted by the first converting means; and a second converting means for converting the control amounts for each of the degrees of freedom determined by the control means into control amounts for controlling the driving devices.

8. The exposure apparatus according to claim 7, wherein the second converting means is a converting device, connected to the respective driving devices, for converting the control amounts for each of the degrees of freedom determined by the control means provided for each of the degrees of freedom into command values for controlling the respective driving devices.

9. The exposure apparatus according to claim 7, wherein the control means provided for each of the degrees of freedom determines the control amount for each of the degrees of freedom necessary for the movement of the center of gravity by means of the (proportional+integral) operation on the basis of a difference between a value obtained by conversion into velocity from the positional deviation of the center of gravity for each of the degrees of freedom and the velocity of the center of gravity for each of the degrees of freedom converted by the first converting means.

10. The exposure apparatus according to claim 7, wherein the stage has three degrees of freedom in X, Y, and θ directions, and it has two driving devices for moving the stage in the X direction and two driving devices for moving the stage in the Y direction.

11. The exposure apparatus according to claim 7, wherein the stage driving device is selected from the group consisting of a linear motor, a combination of a rotary motor and a ball screw element, and a piezoelectric element.

12. The exposure apparatus according to claim 7, wherein the first converting means comprises a system for compensating delay time.

13. The exposure apparatus according to claim 7, wherein the exposure apparatus is a scanning type exposure apparatus.

14. The exposure apparatus according to claim 7, wherein the exposure apparatus is a step-and-repeat type exposure apparatus.

15. A stage apparatus comprising:

stage driving devices of a number larger than degrees of freedom of a stage;

a position detector which detects a position of the stage by illuminating a measuring light to the stage;

an arithmetic circuit which determines control amounts of the stage for each of the degrees of freedom on the basis of information detected by the position detector, the arithmetic circuit being connected with the position detector; and a converting circuit which converts the control amounts of the stage for each of the degrees of freedom into driving amounts for each of the stage driving devices, the converting circuit being connected with the arithmetic circuit.

16. The stage apparatus according to claim 15, wherein the stage has three degrees of freedom in X, Y, and θ directions, and it has two driving devices for moving the stage in the X direction and two driving devices for moving the stage in the Y direction.

17. The stage apparatus according to claim 15, wherein the stage driving device is selected from the group consisting of a linear motor, a combination of a rotary motor and a ball screw element, and a piezoelectric element.

18. The stage apparatus according to claim 15, wherein the arithmetic circuit comprises a system for compensating delay time.

19. The stage apparatus according to claim 15, wherein the position detector is an interferometer.

20. An exposure apparatus for transforming a pattern formed on a mask onto a photosensitive substrate through a projection optical system, comprising:

a mask stage;

a substrate stage;

stage driving devices of a number larger than degrees of freedom of at least one of the mask stage and the substrate stage;

a position detector which detects a position of the at least one of the mask stage and the substrate stage by illuminating a measuring light to the at least one of the mask stage and the substrate stage;

an arithmetic circuit which determines control amounts for each of the degrees of freedom on the basis of the information detected by the position detector, the arithmetic circuit being connected with the position detector; and a converting circuit which converts the control amounts for each of the degrees of freedom into driving amounts for each of the stage driving devices, the converting circuit being connected with the arithmetic circuit.

21. The exposure apparatus according to claim 20, wherein the stage driving device is selected from the group consisting of a linear motor, a combination of a rotary motor and a ball screw element, and a piezoelectric element.

22. The exposure apparatus according to claim 20, wherein the arithmetic circuit comprises a system for compensating delay time.

23. The exposure apparatus according to claim 20, wherein the exposure apparatus is a scanning type exposure apparatus.

24. The exposure apparatus according to claim 20, wherein the exposure apparatus is a step-and-repeat type exposure apparatus.

25. The exposure apparatus according to claim 20, wherein the position detector is an interferometer.

26. A method for controlling a stage having a plurality of degrees of freedom comprising the steps of:

determining control amounts of the stage for each of the degrees of freedom of the stage; and converting the control amounts of the stage for each of the degrees of freedom, into each of driving amounts for a plurality of driving systems to drive the stage.

27. The method according to claim 26, wherein the number of the driving systems is larger than degrees of freedom.

28. The method according to claim 26, wherein the degrees of freedom is not less than three.

29. A method for exposing a substrate with a pattern formed on a mask, comprising:

determining control amounts of at least one of a mask stage for holding the mask and a substrate stage for holding the substrate for each of the degrees of freedom of the stage, and converting the control amounts for each of the degrees of freedom into each of driving amounts for a plurality of driving systems for the at least one of the mask stage and the substrate stage.

30. The method according to claim 29, wherein the number of the driving systems is larger than degrees of freedom.

31. The method according to claim 29, wherein the degrees of freedom is no less than three.

* * * * *